US005640042A

United States Patent [19]

Koscica et al.

[11] Patent Number: 5,640,042

[45] Date of Patent: Jun. 17, 1997

[54] THIN FILM FERROELECTRIC VARACTOR

[75] Inventors: Thomas E. Koscica, Clark; Richard W. Babbitt, Fair Haven; William D. Wilber, Neptune, all of N.J.

[73] Assignee: The United States of America as represented by the Secretary of the Army, Washington, D.C.

[21] Appl. No.: 573,357

[22] Filed: Dec. 14, 1995

[51] Int. Cl.[6] .................................................. H01L 29/93

[52] U.S. Cl. .......................... 257/595; 257/602; 257/661; 257/663; 505/210

[58] Field of Search .................................... 257/295, 595, 257/602, 661, 662, 663

[56] References Cited

U.S. PATENT DOCUMENTS

| | | | |
|---|---|---|---|
| 5,032,805 | 7/1991 | Elmer et al. | 333/156 |
| 5,070,241 | 12/1991 | Jack | 250/336.2 |
| 5,329,261 | 7/1994 | Das | 333/17.2 |
| 5,350,606 | 9/1994 | Takada et al. | 427/564 |
| 5,373,176 | 12/1994 | Nakamura | 257/295 |
| 5,442,585 | 8/1995 | Eguchi et al. | 365/149 |
| 5,449,933 | 9/1995 | Shindo et al. | 257/295 |
| 5,514,484 | 5/1996 | Nashimoto | 428/700 |
| 5,538,941 | 7/1996 | Findikoglu et al. | 505/210 |
| 5,567,979 | 10/1996 | Nashimoto et al. | 257/627 |

*Primary Examiner*—Ngân V. Ngô
*Assistant Examiner*—Allan R. Wilson
*Attorney, Agent, or Firm*—Michael Zelenka; William H. Anderson

[57] ABSTRACT

A voltage-variable ceramic capacitance device which has a plurality of layers in a matching lattice structure and which possesses a symmetric voltage characteristic and a determinable voltage breakdown and has a high resistance to overbiasing or reverse biasing from an applied voltage. The device consists of a carrier substrate layer, a high temperature superconducting metallic layer deposited on the substrate, a thin film ferroelectric deposited on the metallic layer, and a plurality of metallic conductive means disposed on the thin film ferroelectric which are placed in electrical contact with RF transmission lines in tuning devices. The voltage breakdown of the device is easily designed by selecting the appropriate thickness of the ceramic, thus enabling a highly capacitive device that can be placed in a position of maximum standing wave voltage in a tuning circuit or tuning mechanism to provide a maximum effect on tunability, especially in high power applications, based on the changes in dielectric constant of the device.

8 Claims, 3 Drawing Sheets

THIN FILM FERROELECTRIC VARACTOR

GOVERNMENT INTEREST

The invention described herein may be manufactured, used, sold, imported, and licensed by or for the government of the United States of America without the payment to us of any royalty thereon.

FIELD OF THE INVENTION

This invention relates to the field of microwave Radio Frequency (RF) tuning circuits, and more particularly to a voltage-variable capacitance device which, by using materials possessing superior voltage-variable capacitance characteristics, in combination with a structure consisting of matching lattices of a plurality of layers, provides enhanced tunability for RF circuits, and the like.

BACKGROUND OF THE INVENTION

In the state of the art, tuning mechanisms and tuning circuits have employed various devices to provide the voltage-variable capacitance function needed for effectively tuning RF circuits.

As is well known to those skilled in the art, varactors are variable capacitance devices in which the capacitance is dependent upon a voltage applied thereto. As such, varactors have been commonly employed in RF tuning applications because the capacitance variations of the varactor caused by an applied voltage has corresponding effects on frequency tuning. In order to have a maximum effect on the tunability of a circuit, the varactor must be placed in a position of maximum standing wave voltage in the tuning circuit because the mount of tuning is dependent on the voltage-controlled capacitance variations resulting from changes in the semiconductor depletion region capacitance in the varactor. Consequently, varactors are typically characterized in terms of the range of capacitance variations and the breakdown voltage.

Semiconductor-based varactors have been specifically used in a various number of applications through the years, but nevertheless have numerous disadvantages. Most notably, the inherent properties of semiconductor materials cause these semiconductor varactors to be susceptible to overheating and burnout if forward biased or reverse biased with an excessive applied voltage. Specifically, semiconductor p-n junction devices have a depletion region that is subjected to high electric field stress, and as a result, the semiconductor devices tend to break down as the applied voltage is varied. Furthermore, the breakdown voltage of semiconductor devices is not easily scalable because the depletion region is fixed and the doping of the p-n junction must be altered to change the breakdown voltage characteristics. Moreover, semiconductor p-n junction devices typically have asymmetrical voltage characteristics as a result of current flow that is governed by the density and movement of holes and electrons. Furthermore, semiconductor materials typically have dielectric constants in the range of 10 to 15, and consequently, the capacitance of semiconductor-based varactors is limited by these lower range dielectric constants.

Even though thin film semiconductor varactors constructed from silicon compositions offer relatively high switching speeds and provide relatively high capacitive switching ratios (i.e., switching between the device's maximum and minimum capacitances), some applications require higher capacitances to provide a maximum effect on tunability.

To address the disadvantages of the semiconductor prior art devices, ferroelectrics have been increasingly used for various applications. The most notable applications include non-volatile memories, pyroelectric type infrared sensors, and to a lesser extent, RF applications. As is well-known in the art, some of the more desirable properties of the ferroelectric materials include the increased power handling capacity, low loss, large permittivity, as well as higher tolerance to burnout.

Ferroelectric varactors based on bulk cut material also exist in the field of art. However, the thickness of these devices typically limit the total capacitive effect. To address these capacitance limitations, thin film ferroelectrics are becoming more common, as evidenced by recent applications in the state of the an. The ferroelectrics predominantly used in thin film capacitance applications include dielectric materials such as barium titanate, lead zirconate titanate (PZT), and strontium titanate. The dielectric characteristics of these and other ferroelectric materials known in the state of the art offer significant advantages to overcome the limitations of semiconductor and bulk cut ferroelectric devices. However, the performance of devices using these thin film ferroelectric materials is dependent on numerous factors such as: the inherent properties of the ferroelectric compositions; the interaction between the thin film ferroelectric and the other layers in the device (e.g. reactivity between the thin film and the substrate or electrodes); the structure of the thin film device; as well as the thin film deposition techniques.

Several problems have persisted in the thin film prior art. For instance, the thickness of the thin film has been reduced in some devices to achieve higher capacitance; however, the resulting thin film is too thin and thus has poor film quality which negatively affects the performance of the device. Another drawback in the prior an is that a large leakage current may exist as a result of the close proximity of the dielectric thin film to the electrodes of a device. To address these limitations, some devices in the prior art have substituted for the conventional electrode material with a dielectric layer having added impurities to provide the electrical characteristics of an electrode, whereas some have used a thin film metal alloy to provide this needed functionality. However, these devices typically sacrifice some of the capacitive performance benefits that otherwise would result with the use of a more conductive material in combination with the ferroelectric thin film.

Conventional ferroelectric devices typically have another drawback with respect to the mismatched crystal structure of the various layers, specifically with regard to mismatched lattice constants. While some advances have been made to produce a structurally matched ferroelectric device, these advances have not produced a ferroelectric with an elemental composition that is ideally suited for use in RF tuning applications. In general, thin film ferroelectric devices in the state of the art are typically suited for particular applications, and a thin film ferroelectric device with optimal characteristics for RF tuning applications has not yet been provided.

SUMMARY OF THE INVENTION

Accordingly, the present invention provides a thin film ferroelectric varactor offering maximum tunability without being susceptible to overheating or burnout caused by overbiasing or reverse biasing from an applied voltage.

Illustratively, the thin film ferroelectric varactor according to the invention is comprised of a plurality of thin film layers. Specifically, the varactor includes a carrier substrate layer, a metallic conductive layer deposited on the carrier substrate, a thin film ferroelectric deposited on the metallic conductive layer, and a plurality of longitudinally spaced metallic conductive means disposed on the thin film ferroelectric.

In a preferred embodiment of the invention, the carrier substrate layer, the metallic conductive layer, and the thin film ferroelectric layer have matching lattices and thereby form a matched crystal structure with alignment along the c-axis. In a second preferred embodiment of the invention, the device is a matched crystal structure and the carrier substrate has the elemental composition MgO, the metallic conductive layer is a high temperature superconducting film of YBaCu-Oxide (HTS), and the thin film ferroelectric layer has the elemental composition $Ba_xSr_{1-x}TiO_3$, where x is less than 1 and represents the fraction of barium (Ba). The thin film deposition method used for the matched crystal structure can be one of several vacuum deposition methods, the most preferred being laser ablation.

As compared with voltage-variable capacitance devices in the prior art, the thin film ferroelectric varactor according to the invention overcomes the shortcomings of the prior art by providing a high tolerance to the breakdown effects of an applied voltage. In contrast to semiconductor varactors, the thin film ferroelectric varactor is a ceramic insulator with symmetrical voltage characteristics. Furthermore, the inherent properties of the pure dielectric material in the invention eliminate the overheating and burnout problems found in the prior art semiconductor devices. The breakdown voltage in the invention can be easily scaled by selecting the appropriate thickness of the ceramic. Consequently, because of the improved voltage breakdown characteristics, the thin film ferroelectric varactor can be placed at a position of maximum standing wave voltage in tuning circuits thereby ensuring maximum effect on RF tunability.

In accordance with another aspect of the invention, the thin film ferroelectric varactor provides higher capacitances than existing prior art semiconductor varactors as well as other ferroelectric varactors that are based on bulk cut material. As compared with semiconductor-based devices, the thin film ferroelectric varactor uses a ceramic insulator which has much higher dielectric constants (e.g., in the 100 to 1200 range). Consequently, these higher dielectric constants translate to capacitance values of greater magnitude than can be achieved with semiconductor varactors. Furthermore, the capacitance of a varactor is inversely proportional to the thickness of the layers, so the thin film ferroelectric varactor according to the invention will necessarily have higher capacitance than a bulk cut ferroelectric device because conventional bulk cutting methods invariably produce a thicker material. Consequently, the thin film ferroelectric varactor possesses higher capacitances and therefore has a greater effect on the tunability of circuits that require a larger tuning capacitor as compared with comparable prior art devices made from semiconductor or bulk cut ferroelectric materials.

The thin film ferroelectric varactor according to the invention solves the problem of poor film quality by providing a plurality of layers having matching lattices and complementary physical properties. In the most preferred embodiment of the invention, the thin film is deposited using laser ablation which also ensures higher quality of the thin film. The elemental composition of the metallic conductive layer of the invention also eliminates the problems in prior art thin film ferroelectric devices in which the thin film ferroelectric negatively interacts with the conductive layer.

The matched crystal structure of the invention offers several advantages over prior art devices that are also structurally matched. Specifically, the thin film ferroelectric varactor according to the principles of the invention includes a highly conductive metallic layer which acts as a capacitor layer and provides, in combination with the other layers, a highly capacitive, voltage-variable, structurally matched ferroelectric device for specific use in RF tuning applications.

Thus, the illustrative embodiments of the invention shown and described herein largely overcome the shortcomings of the prior art by providing a highly capacitive thin film ferroelectric varactor with optimal voltage breakdown characteristics and that is not susceptible to overheating and burnout problems resulting from overbiasing or reverse biasing as in a semiconductor varactor. Moreover, the invention can be easily designed by selecting a ceramic thickness to achieve the desired voltage breakdown value and therefore can be used in a wide range of communication system applications requiring tunable elements such as voltage controlled oscillators, RF sources, tunable amplifier matching sections, variable filters, and others.

The invention is described in detail hereinafter with reference to the accompanying drawings, which together illustrate the preferred embodiments of the invention. The scope of the invention, however, is limited only by the claims appended hereto.

BRIEF DESCRIPTION OF THE DRAWINGS

The features of the invention will be readily understood in light of the following detailed description of the invention and the attached drawings, wherein.

DETAILED DESCRIPTION OF THE INVENTION

Figure 1:
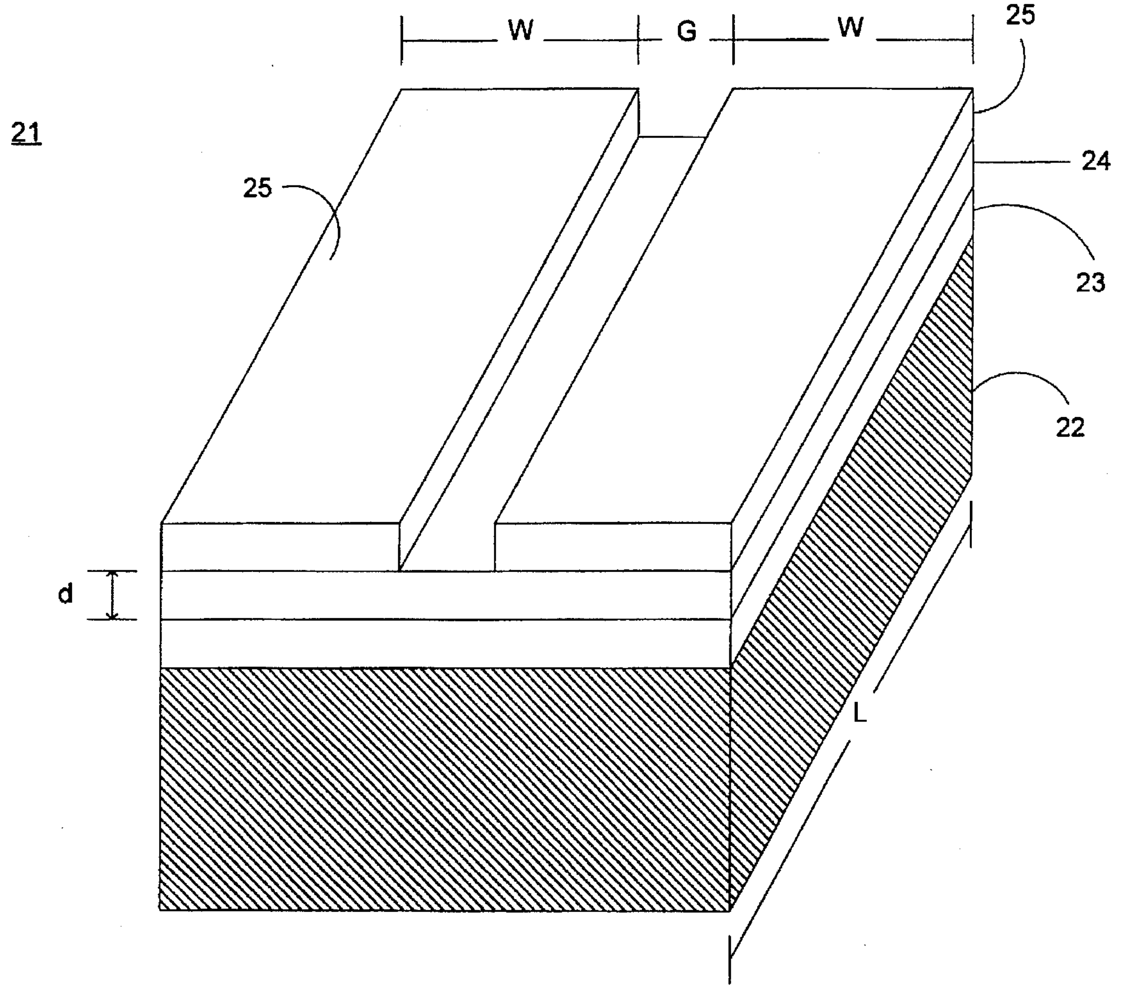
FIG. 1 is a perspective view of a preferred embodiment of the invention.

For a more detailed appreciation of the invention, attention is first invited to FIG. 1 which shows a thin film ferroelectric varactor 21 which is a ceramic comprised of a plurality of thin film layers including a carrier substrate 22, a metallic conductive layer 23 deposited on the carrier substrate 22, a thin film ferroelectric layer 24 deposited on the metallic conductive layer 23, and a plurality of longitudinally spaced metallic conductive means 25 disposed on the thin film ferroelectric layer 24.

In a preferred embodiment of the invention, the carrier substrate 22, the metallic conductive layer 23, and the thin film ferroelectric layer 24 form a matched crystal structure. Specifically, the matched crystal structure is obtained by ensuring C-axis alignment, matched lattices (e.g. matched lattice spacing), and selection of complementary crystal types. In a second preferred embodiment, the varactor 21 is a matched crystal structure and the carrier substrate 22 has the elemental composition MgO, the metallic conductive layer 23 is a high temperature superconducting film of YBaCu-Oxide (HTS), and the thin film ferroelectric layer 24 has the elemental composition $Ba_xSr_{1-x}TiO_3$, where x is less than 1. To achieve a preferred match in lattices, the various layers are oriented in the [001] crystal plane. Although several vacuum deposition methods can be used for thin film deposition, laser ablation is used in the most preferred embodiment of the invention for thin film deposition to produce a matched crystal structure. Other conventional thin film deposition methods known in the state of the art can be used effectively to fabricate varactor 21 in an unmatched crystal form.

Because of the structural and electrical symmetry, the varactor 21 with matched crystal structure provides a greater amount of tunability than varactor 21 with an unmatched crystal structure. However, although varactor 21 with a matched crystal structure has superior characteristics, the varactor 21 with an unmatched crystal structure still offers several advantages over prior an devices.

As illustrated in FIG. 1, each of the metallic conductive means 25 has a surface area represented by length L and width W. The metallic conductive means 25 are disposed on the thin film ferroelectric layer 24 in such a manner so that the metallic conductive means 25 are longitudinally spaced from each other by a gap G. The elemental composition of the metallic conductive means 25 is arbitrary provided the material exhibits the necessary conductive properties. Furthermore, the varactor 21 in FIG. 1 uses metal conductor pads as the metallic conductive means 25, but other equivalent means could also be used.

The varactor 21 is not restricted to a particular geometrical configuration, but rather the dimensions of the varactor 21 can be scaled accordingly to exhibit the necessary properties to satisfy particular requirements for a given application. As illustrated in FIG. 1, the critical dimensions of varactor 21 include length L, width W, thickness d, and gap G. Variations in L, W, and d will have a corresponding effect on the capacitance on varactor 21, while variations in d and G will have a corresponding effect on the breakdown voltage of varactor 21.

The scalability of these performance characteristics in varactor 21, namely capacitance and the breakdown voltage, provides significant advantages over prior an varactor devices. More specifically, the breakdown voltage of varactor 21 can be scaled accordingly to provide a device with a higher breakdown voltage than in the prior art devices. The higher breakdown voltage is achievable both because of the inherent properties of pure dielectric material as compared with prior art semiconductor materials, as well as the ability to increase the breakdown voltage by increasing the thickness of the device. In semiconductor devices in the prior art, the scalability of the breakdown voltage is more dependent on the doping of the p-n junction than on the physical dimensions.

To illustrate, the breakdown voltage (i.e. voltage maximum) of varactor 21 is represented by:

$$V_{MAX}=2d\,\epsilon_{Field\ Max};$$

where d=thickness of the thin film ferroelectric layer and $\epsilon_{Field\ Max}$=maximum electrical field. The varactor 21 shown in FIG. 1 is the equivalent of two capacitors (as further illustrated in FIG. 2), and consequently the thickness d must be accounted for twice in the calculation of the breakdown voltage $V_{MAX}$.

It should be noted, however, that the breakdown voltage of varactor 21 is determined by gap G in a situation where gap G measures less than thickness d. Consequently, in this situation, the breakdown voltage would be represented by:

$$V_{MAX}=G\,\epsilon_{Field\ Max}.$$

The breakdown voltage is therefore limited by either the lesser of the gap G between the metallic conductive means 25 or the thickness d of the thin film ferroelectric layer 24. Realistically, the thickness d is typically much less than gap G in thin film devices such as varactor 21 and therefore the breakdown voltage is typically governed by the thickness d. As can be seen from the above relationships, the breakdown voltage of the thin film ferroelectric varactor 21 is easily designed by selecting the desired thickness d of the ceramic.

As for the capacitance of varactor 21, the selection of the elemental composition of the thin film ferroelectric layer 24 and the scalability of dimensions L, W, and d are the determining factors. Moreover, the capacitive characteristic of the thin film ferroelectric varactor 21 in FIG. 1 is represented by:

$$C_1 \approx \frac{\epsilon_0 \epsilon_r L W}{2d}$$

where:

$C_1$=total capacitance of the device, $\epsilon_0$=permittivity of free space constant, $\epsilon_r$=relative dielectric constant, L=length, W=width, d=thickness of the thin film ferroelectric layer.

Figure 2:
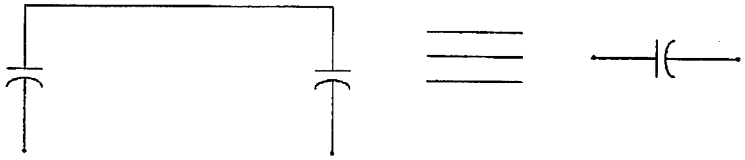
FIG. 2 is the model equivalent of the capacitance of the device helpful in understanding the invention.

As previously indicated, the varactor 21 shown in FIG. 1 is the equivalent of two equally rated capacitors (as further depicted in FIG. 2). Therefore, the equivalent overall capacitance $C_1$ is calculated accordingly (e.g., factor of 2d versus d).

In varactor 21, the thin film layer 24 must be a dielectric material with electrooptical properties (i.e., permittivity changes with an applied voltage). Because these materials possess greater dielectric constants (e.g., $\epsilon_r$ in range of 100–1200) than prior art semiconductor materials (e.g., $\epsilon_r$ in range of 10–15), the varactor 21 will consequently have higher capacitance than semiconductor varactors.

In a preferred embodiment of the invention, the thin film ferroelectric layer 24 has the elemental composition $Ba_xSr_{1-x}TiO_3$, where x is less than 1 and represents the fraction of barium (Ba). The amount of capacitance shift that can be achieved with varactor 21 in response to an applied voltage can be varied by changing the composition of $Ba_xSr_{1-x}TiO_3$. For example, by increasing the fraction of barium (Ba), the overall capacitance shift in the varactor 21 is correspondingly increased because of the higher amount of electrooptic effect present in $BaTiO_3$.

As indicated in the above formula, the capacitance $C_1$ of varactor 21 can also be easily scaled according to the dimensions L, W, and d. Although the selection of an appropriate thickness d for desired capacitance $C_1$ will also have an inverse effect on the breakdown voltage of the device, the varactor 21 can be easily scaled by first determining the desired capacitance $C_1$ and breakdown voltage $V_{MAX}$ and then solving for the dimensional parameters L, W, and d accordingly.

Furthermore, because capacitance $C_1$ is inversely proportional to the thickness d, a thin film varactor device according to the invention will invariably have a higher capacitance than prior an ferroelectric varactor devices that are based on bulk cut material, since the conventional bulk cutting methods will not produce a thickness d that is comparable to the thickness d achieved by thin film deposition techniques used in the invention.

The amount of tunability provided by varactor 21 is represented by:

$$\frac{\Delta C_1}{C_1} = \frac{\epsilon_r\,(\text{unbiased}) - \epsilon_r\,(\text{biased})}{\epsilon_r\,(\text{unbiased})};$$

where:

$\Delta C_1$=change (shift) in capacitance caused by the application of bias voltage, and $\epsilon_r$ (unbiased)=the permittivity (i.e., dielectric constant) with no applied voltage $\epsilon_r$ (biased)=the permittivity (i.e., dielectric constant) with applied voltage $\epsilon_r$ (unbiased)−$\epsilon_r$ (biased)=change in permittivity (i.e., dielectric constant) caused by the application of bias voltage.

In order to achieve maximum tunability with varactor 21, maximum voltage must be applied to cause the changes in dielectric constant needed to produce the increased shift in capacitance $\Delta C_1$. Consequently, the varactor 21 should be placed in a position of maximum standing wave voltage within the tuning circuit or tuning mechanism. Because varactor 21 is a highly capacitive device with a scalable breakdown voltage and is not susceptible to overheating and burnout, maximum tunability can be provided in a wide range of RF transmission applications.

Figure 3:
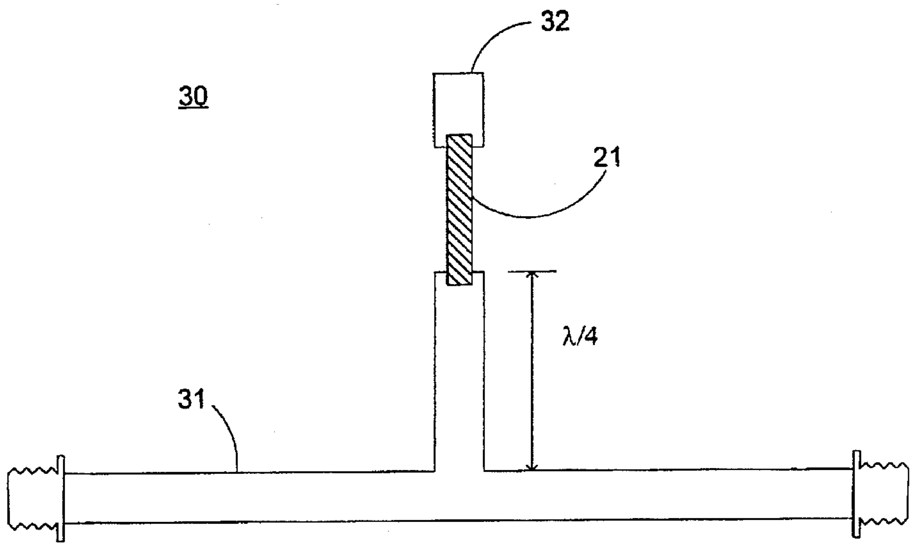
FIGS. 3 and 4 are perspective views of microstrip line applications employing the invention.
Figure 4:
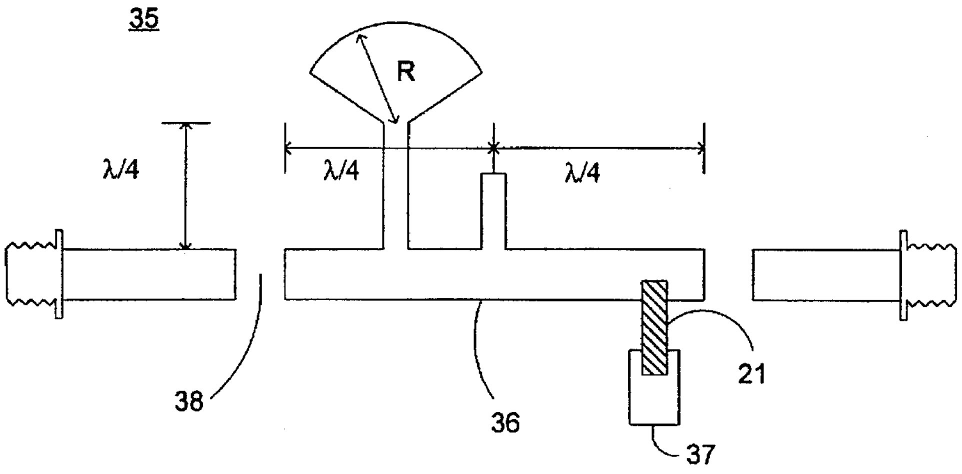

In operation, the varactor 21 can be used for a wide range of microwave transmission line applications. One specifically practical use is with microstrip line applications such as those depicted in FIGS. 3 and 4. FIG. 3 represents a microstrip line application of the varactor 21 in an active tuning stub 30 and FIG. 4 represents a microstrip line application of varactor 21 in a tunable resonator 35 for oscillator adjustments. As depicted in FIGS. 3 and 4, the varactor 21 (FIG. 1) is being used as a loading capacitor since the varactor 21 is placed in parallel with and provides a load on the main microstrip line 31 (FIG. 3) and line 36 (FIG. 4). Another practical use of varactor 21 in microstrip line applications would be as a coupling capacitor. For example, in FIG. 4, varactor 21 could be placed in series with the main microstrip line 36 across gap 38.

To further illustrate the placement of varactor 21 in the devices shown in FIGS. 3 and 4, the metallic conductive means 25 (FIG. 1) of varactor 21 are placed in electrical contact with the surface of the microstrip lines in such a manner so that one side of the microstrip is coupled to the main microstrip line 31 (FIG. 3) and 36 (FIG. 4), while the other side of varactor 21 has a via connection to ground 32 (FIG. 3) and 37 (FIG. 4). The varactor 21 is placed at the open end of either the stub 30 (FIG. 3) or resonator 35 (FIG. 4) so that it will be at a position of maximum standing wave voltage. A bias voltage (not shown in the accompanying drawings) can be applied accordingly to the varactor 21, to effect a variation in the capacitance corresponding to changes in the dielectric constant of varactor 21. Consequently, the amount of tuning that can be achieved by using varactor 21 is dependent on the changes in dielectric constant brought about by the bias voltage. Because the structure and composition of varactor 21 enable placement in the tuning circuit at a position of maximum standing wave voltage, the varactor 21 has a maximum effect on the tunability in such microstrip applications. This is especially useful for high power applications with their associated high voltages.

Figure 5:
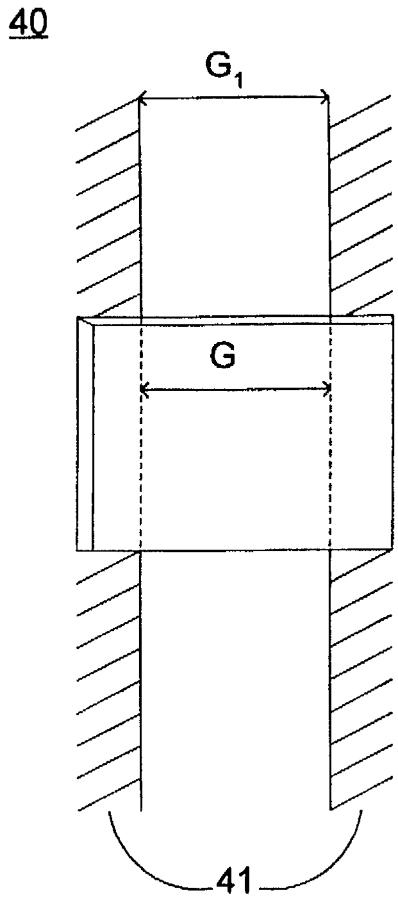
FIG. 5 is a perspective view of a slot line transmission application employing the invention.

Likewise, the construction of varactor 21 as depicted in FIG. 1 would be equally suitable for slot line transmission applications. Specifically, varactor 21 would be ideally constructed so that the gap G of varactor 21 (FIG. 1) would equal gap $G_1$ of the slot line transmission line 40 shown in FIG. 5. As further illustrated in FIG. 5, the metallic conductive means 25 of varactor 21 (FIG. 1) would be placed in electrical contact with the conductive elements 41 of slot line 40.

Other RF tuning applications (e.g. coplanar transmission applications) not specifically described or illustrated herein can also employ varactor 21 (FIG. 1) or varactor 21 with minor variations (e.g., three metallic conductive means 25 for coplanar applications).

Although the present invention has been described in relation to several different embodiments, many other configurations and applications of the present invention will become apparent to those skilled in the art. Therefore, the present invention should not be construed to be limited by the specific disclosure, but only by the appended claims.

What is claimed is:

1. A thin film ferroelectric varactor device, comprising:

a carrier substrate layer;

a metallic conductive layer deposited on said carrier substrate layer;

a thin film ferroelectric deposited on said metallic conductive layer; and a plurality of metallic conductive means longitudinally disposed on said thin film ferroelectric, said conductive means defining longitudinal gaps therebetween.

2. A thin film ferroelectric varactor device as recited in claim 1, wherein said carrier substrate layer, said metallic conductive layer, and said thin film ferroelectric layer have matching lattice crystal structures.

3. A thin film ferroelectric varactor device as recited in claim 2, wherein:

said carrier substrate layer has an elemental composition of MgO;

said metallic conductive layer is a high temperature superconducting film of YBaCu-Oxide; and said thin film ferroelectric layer has an elemental composition of $Ba_xSr_{1-x}TiO_3$, where x is less than 1.

4. A thin film ferroelectric varactor device as recited in claim 2, wherein said thin film ferroelectric layer is deposited on said metallic conductive layer by laser ablation.

5. A thin film ferroelectric varactor device, comprising:

a crystalline carrier substrate layer having a predetermined lattice structure;

a crystalline superconducting film deposited on said carrier substrate layer, said superconducting film having a predetermined lattice structure that matches the lattice structure of said carrier substrate layer;

a crystalline thin film ferroelectric deposited on said superconducting film, said thin film ferroelectric having a predetermined lattice structure that matches the lattice structure of said superconducting film and said carrier substrate layer; and a plurality of metallic conductive means longitudinally disposed on said thin film ferroelectric, said conductive means defining longitudinal gaps therebetween.

6. A thin film ferroelectric varactor device as recited in claim 5, wherein:

said carrier substrate layer has an elemental composition of MgO;

said superconducting film has an elemental composition of YBaCu-Oxide; and said thin film ferroelectric layer has an elemental composition of $Ba_xSr_{1-x}TiO_3$, where x is less than 1.

7. A thin film ferroelectric varactor device, comprising:

a carrier substrate layer having a crystalline structure oriented in the [001] crystal plane;

a metallic conductive layer deposited on said carrier substrate layer; said metallic conductive layer having a crystalline structure oriented in the [001] crystal plane and matching the crystalline structure of said carrier substrate;

a thin film ferroelectric deposited on said metallic conductive layer, said thin film ferroelectric having a perovskite crystalline structure oriented in the [001] crystal plane and matching the crystalline structure of said metallic conductive layer and said carrier substrate; and a plurality of metallic conductive means longitudinally disposed on said thin film ferroelectric, said conductive means defining longitudinal gaps therebetween.

8. A thin film ferroelectric varactor device as recited in claim 7, wherein:

said carrier substrate layer has an elemental composition of MgO;

said metallic conductive layer is a high temperature superconducting film of YBaCu-Oxide; and said thin film ferroelectric layer has an elemental composition of $Ba_xSr_{1-x}TiO_3$, where x is less than 1.

* * * * *